United States Patent [19]

Yoshida et al.

[11] Patent Number: 4,954,853
[45] Date of Patent: Sep. 4, 1990

[54] OPTICAL SEMICONDUCTOR DEVICE

[75] Inventors: Kazuomi Yoshida; Hideyo Higuchi; Hitoshi Mizuochi; Yousuke Yamamoto, all of Hyogo, Japan

[73] Assignee: Mitsubishi Denki Kabushiki Kaisha, Tokyo, Japan

[21] Appl. No.: 220,338

[22] Filed: Jul. 14, 1988

Related U.S. Application Data

[63] Continuation of Ser. No. 7,013, Jan. 27, 1987, abandoned.

[30] Foreign Application Priority Data

Jan. 24, 1986 [JP] Japan .................................. 61-14081

[51] Int. Cl.$^5$ ............................................. H01L 33/00
[52] U.S. Cl. ...................................... 357/17; 357/19; 372/36; 372/75
[58] Field of Search ............... 357/17, 19, 74; 372/36, 372/75

[56] References Cited

U.S. PATENT DOCUMENTS

| | | | |
|---|---|---|---|
| 4,058,821 | 11/1977 | Miyoshi et al. | 357/19 |
| 4,186,995 | 2/1980 | Schumacher | 357/17 |
| 4,295,152 | 10/1981 | Khoe et al. | 357/17 |
| 4,399,453 | 8/1983 | Berg et al. | 357/17 |
| 4,675,058 | 6/1987 | Plaster | 357/17 |
| 4,768,070 | 8/1988 | Takizawa et al. | 357/19 |
| 4,797,895 | 1/1989 | Kokubo et al. | 357/19 |

FOREIGN PATENT DOCUMENTS

| | | | |
|---|---|---|---|
| 0019687 | 2/1979 | Japan | 357/17 |
| 0161684 | 7/1988 | Japan | 357/19 |

Primary Examiner—Rolf Hille
Assistant Examiner—Hoanganh Le
Attorney, Agent, or Firm—Lowe, Price, LeBlanc, Becker & Shur

[57] ABSTRACT

In an optical semiconductor device in which a light emitting element and a light receiving element for monitoring light from the light emitting element are mounted integrally, a spherical lens is provided at a light receiving portion of the light receiving element, the lens having a light receiving area larger than that of said light receiving portion and the spherical surface of the spherical lens is oriented to the light emitting element.

10 Claims, 3 Drawing Sheets

OPTICAL SEMICONDUCTOR DEVICE

This application is a continuation of application Ser. No. 007,013, filed Jan. 27, 1987, now abandoned.

BACKGROUND OF THE INVENTION

1. Field of the Invention

The present invention relates to an optical semiconductor device in which a light emitting element and a light receiving photo-electric conversion element for monitoring light from said light emitting element are mounted integrally.

2. Description of the Prior Art

FIG. 1 is a cross sectional view of a conventional semiconductor light receiving photo-electric conversion element having a planar structure. In FIG. 1, the semiconductor light receiving photo-electric conversion element 14 is formed of a N type semiconductor substrate 1, a p type semiconductor layer 2 formed by diffusion, etc. on the substrate 1, an insulating layer 3, a p side electrode 4 and a n side electrode 5.

FIG. 2 shows a conventional optical semiconductor device in which a semiconductor light emitting element and a semiconductor light receiving photo-electric conversion element for monitoring and feeding back the optical output from the light emitting element are mounted on the same package. In FIG. 2, the conventional optical semiconductor device comprises a light emitting element 11, a block 13 for fixing the light emitting element 11, a light receiving photo-electric conversion element 14, a mount base 18 for mounting the light receiving element 14, a package 15, a lead terminal 16 and a lead wire 17. As shown in FIG. 2, the light receiving element 14 is mounted at an inclination to the light from the light emitting element. This is to prevent the reflected light at the light receiving portion from returning to the light emitting element, since the returned light derived from the reflection at the light receiving surface of the light receiving element 14 significantly affects the characteristics of the light emitting element 11. A semiconductor laser device devised to prevent the bad influence of the reflected light is disclosed in, for example, Patent Publication Gazette No. 1914/1982, in which a photodiode is mounted at an angle of 8° to 10° with the incident light in order that the light irradiated from the laser light emitting element to the monitoring photodiode may not be reflected to the light emitting element to affect badly.

The operation of the conventional optical semiconductor device shown in FIGS. 1 and 2 will be hereinafter described. As shown in FIG. 2, the light 12a emitted from a rear surface of the light emitting element 11 enters the p type semiconductor layer 2 of the light receiving surface of the light receiving element 14. The incident light is absorbed in each of the layers to generate hole-electron pairs. On this occasion, with a reverse bias applied between the p side electrode 4 and the n side electrode 5, a depletion layer extends at the pn junction interface to generate an electric field, so that the hole-electron pairs move along the electric field and flow to the lead terminal 16 as an optical current.

As shown in FIG. 2, in a conventional optical semiconductor device, the light receiving element 14 must be mounted at an inclination. Therefore, the conventional device presents problems that it must be provided with an inclined mount base 18, that the efficiency of photo-electric conversion lowers and that the work of assembly is troublesome.

SUMMARY OF THE INVENTION

It is a main object of the present invention to provide an optical semiconductor device which prevents reflected light from returning and provides improved efficiency of photo-electric conversion without providing the inclined mount base.

Briefly described, the present invention comprises a light emitting element, a light receiving photo-electric conversion element for monitoring the condition of the emission of the light emitting element, and a spherical lens provided between the light emitting element and the light receiving element, the spherical lens having a light receiving area larger than that of the light receiving portion of the light receiving photo-electric conversion element and the spherical surface of the spherical lens being oriented to the light emitting element.

According to the present invention, the reflected light is scattered at the spherical surface of the spherical lens provided between the light emitting element and the light receiving element. Therefore, the light can be prevented from returning to the light emitting element without inclining the light receiving element and in addition, the efficiency of the photo-electric conversion increases since the light receiving area of the spherical lens is larger than that of the light receiving element.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
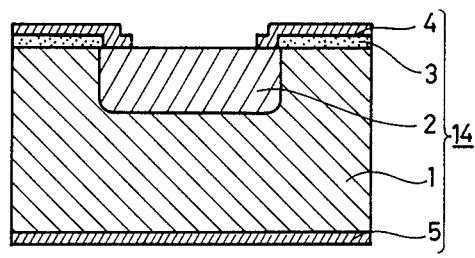
FIG. 1 is a cross sectional view of a light receiving element in a conventional optical semiconductor device.
Figure 2:
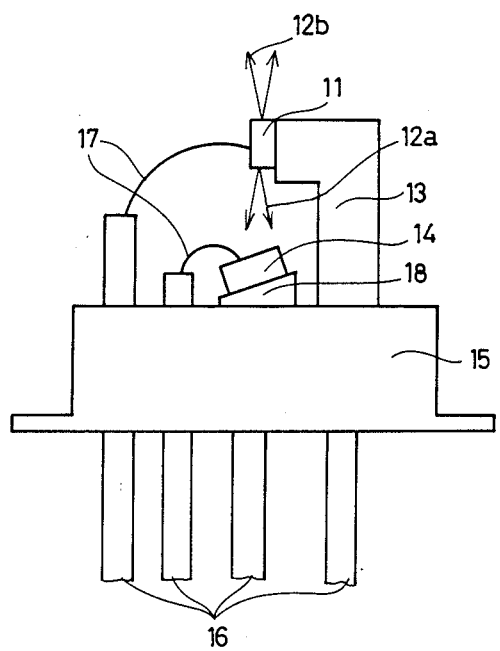
FIG. 2 shows a conventional optical semiconductor device.
Figure 3:
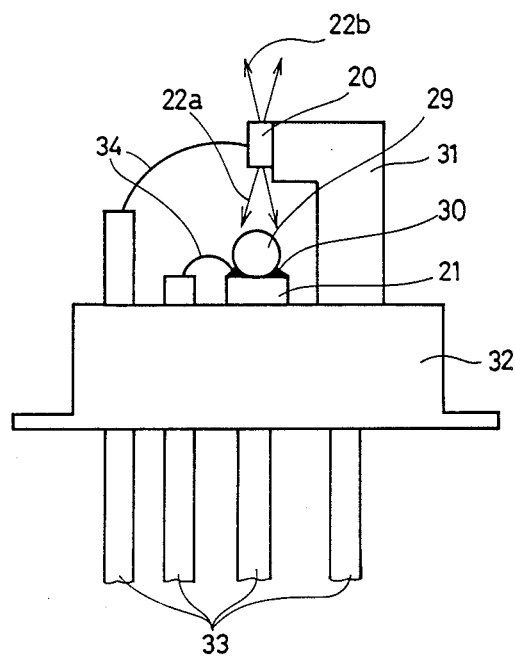
FIG. 3 shows an optical semiconductor device according to one embodiment of the present invention.
Figure 4:
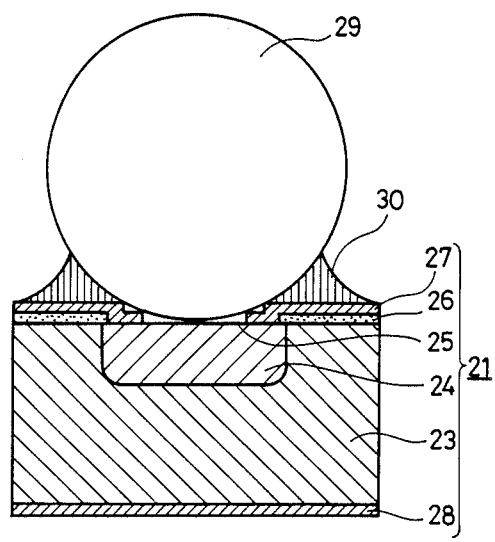
FIG. 4 is an enlarged cross sectional view of the light receiving element and the lens portion of the optical semiconductor device shown in FIG. 3.

FIG. 3 shows an optical semiconductor device according to one embodiment of the present invention and FIG. 4 is an enlarged cross sectional view of the light receiving photo-electric conversion element and the lens portion of the optical semiconductor device shown in FIG. 3. In FIG. 3, the optical semiconductor device according to one embodiment of the present invention comprises a light emitting element 20, a light receiving photo-electric conversion element 21, a lens 29, a block 31, a package 32, a lead terminal 33 and a lead wire 34.

The light emitting element 20 is a semiconductor laser device having two emitting portion, that is, the front surface and the rear surface. The light receiving photo-electric conversion element 21 receives the light 22a from the light emitting portion of the rear surface of the light emitting element 20 for monitoring the condition of emission of the light emitting element 20. As shown in FIG. 4, the light receiving element 21 is formed of a n type semiconductor substrate 23, a p type semiconductor layer 24 formed on the semiconductor substrate 23 by diffusion etc., an insulating layer 26 and a p side electrode 27 provided such that the light receiving portion 25 opens on the p type semiconductor layer 24, and a n side electrode 28.

The lens 29 is a spherical lens fixed with resin 30 on the side of the light receiving portion 25 of the light receiving photo-electric conversion element 21 in such a manner that the lens 29 is placed between the light emitting element 20 and the light receiving element 21. The diameter of the spherical lens 29 is made larger than the maximum length of the light receiving photo-electric conversion portion 25 of the light receiving element 21 so as to cover the light receiving portion 25 entirely.

Figure 5:
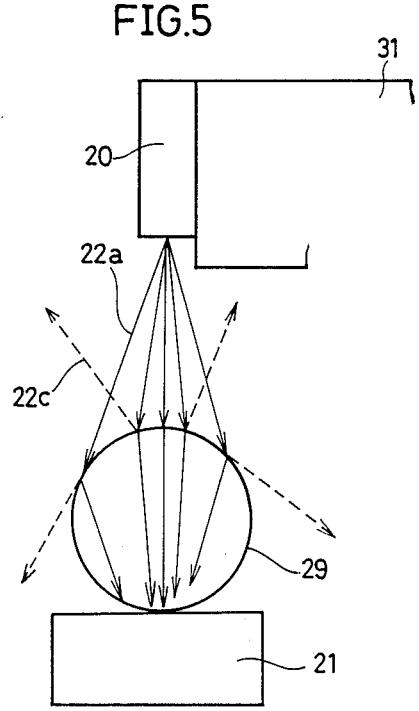
FIG. 5 shows the light path from the light emitting element to the light receiving element.

The operation of the optical semiconductor device according to one embodiment of the present invention shown in FIGS. 3 and 4 will be hereinafter described. When a current is applied to the light emitting element 20 from the lead terminal 33, the light emitting element 20 irradiates light 22a and 22b. The light 22a emitted from the rear surface is condensed by a spherical lens 29 fixed to the light receiving photo-electric conversion element 21 and guided to the light receiving portion 25. As shown in FIG. 5, much light 22a more than the due amount of light irradiated to the surface area of the light receiving portion 25 can be taken in by virtue of the spherical lens 29. Therefore, the efficiency of the photo-electric conversion can be improved. In addition, the reflected light 22c scatters at the surface of the spherical lens 29, so that the amount of light which returns to the light emitting element decreases. Thus, the need for mounting the light receiving photo-electric conversion element 21 with inclination is eliminated, improving the efficiency of mounting. The incident light entered the light receiving element 21 is absorbed in each of the layers and the hole-electron pairs are generated, and the optical current flows to the lead terminal 33.

Although in the above described embodiment, a spherical lens is provided at the light receiving photo-electric conversion element with a light receiving portion of a p type semiconductor layer, it may be provided at a light receiving element with a light receiving portion of n type semiconductor layer. Any light receiving photo-electric conversion element with a spherical lens provided at the light receiving portion thereof may be used to obtain the same effect.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In an optical semiconductor device including a light emitting element and a light receiving photo-electric conversion element for monitoring the condition of emission of said light emitting element, the improvement comprising:
   preventing means for preventing light emitted by said light emitting element from returning to said light emitting element, and
   mounting means for mounting said preventing means on said light receiving photo-electric conversion element independently of angular constraints therefor,
   wherein said photo-electric conversion element is mounted having a surface substantially parallel to a light emitting surface of said light emitting element.

2. An optical semiconductor device according to claim 1, wherein said preventing means comprises a lens having a light receiving area larger than that of the light receiving portion of said light receiving photo-electric conversion element provided between said light receiving photo-electric conversion element and said light emitting element, thereby increasing efficiency of photo-electric conversion by said photo-electric conversion element by providing coverage of the entire light receiving portion thereof.

3. An optical semiconductor device according to claim 2 wherein said lens is substantially spherical.

4. An optical semiconductor device according to claim 1, wherein
   said mounting means comprises a resin, receiving said preventing means.

5. An optical semiconductor device according to claim 1 wherein said preventing means comprises a lens.

6. An optical semiconductor device according to claim 5 wherein said lens is substantially spherical.

7. In an optical semiconductor device including a light emitting element and a light receiving photo-electric conversion element for monitoring the condition of emission of said light emitting element, the improvement comprising:
   reflection preventing means for preventing light emitted by said light emitting element from returning to said light emitting element, and
   mounting means for mounting said reflection preventing means on said light receiving photo-electric conversion element independently of angular constraints therefor,
   wherein said photo-electric conversion element is mounted having a surface substantially parallel to a light emitting surface of said light emitting element.

8. An optical semiconductor device as recited in claim 7, wherein said reflection preventing means comprises a spherical lens, thereby preventing return of light reflected by the lens to the light emitting element and improving ability of the device to monitor the light emitting condition of the light emitting element.

9. An optical semiconductor device according to claim 8, wherein
   said mounting means comprises a resin, receiving said reflection preventing means.

10. In an optical semiconductor device including a light emitting element and a light receiving device including a photo-electric conversion element for monitoring emissions of said light emitting element, the improvement wherein said photo-electric conversion element of said light receiving device includes parallel top and bottom major surfaces;
   said photo-electric conversion element being mounted directly on a surface of a package parallel to a light emitting surface of said light emitting element so that the top and bottom major surfaces thereof are disposed parallel to the light emitting surface of light emitting element;
   said light receiving device including a lens having a light receiving area which is larger than a light receiving area of said photo-electric conversion element thereby to increase efficiency of photo-electric conversion and to prevent return of reflected light to the light emitting element and improve the ability of the light receiving device to monitor the light emitting condition of the light emitting element.

* * * * *